(12) United States Patent
Chang et al.

(10) Patent No.: US 10,020,284 B2
(45) Date of Patent: Jul. 10, 2018

(54) FUNCTIONAL SPACER FOR SIP AND METHODS FOR FORMING THE SAME

(71) Applicants: Taiwan Semiconductor Manufacturing Company, Ltd., Hsin-Chu (TW); Global Unichip Corp., Hsin-Chu (TW)

(72) Inventors: Yu-Ru Chang, Zhubei (TW); Chung-Kai Wang, New Taipei (TW); Ming-Che Wu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 35 days.

(21) Appl. No.: 14/867,893

(22) Filed: Sep. 28, 2015

(65) Prior Publication Data

US 2016/0020191 A1 Jan. 21, 2016

Related U.S. Application Data

(62) Division of application No. 13/405,018, filed on Feb. 24, 2012, now Pat. No. 9,147,670.

(51) Int. Cl.
*H01L 21/00* (2006.01)
*H01L 23/00* (2006.01)
(Continued)

(52) U.S. Cl.
CPC ............ *H01L 24/97* (2013.01); *H01L 21/308* (2013.01); *H01L 21/78* (2013.01); *H01L 23/13* (2013.01); *H01L 23/3128* (2013.01); *H01L 23/49833* (2013.01); *H01L 24/83* (2013.01); *H01L 24/85* (2013.01); *H01L 24/92* (2013.01); *H01L 24/94* (2013.01); *H01L 25/0657* (2013.01); *H01L 23/49816* (2013.01); *H01L 23/552* (2013.01); *H01L 24/48* (2013.01); *H01L 24/73* (2013.01); *H01L 2224/0231* (2013.01); *H01L 2224/16145* (2013.01); *H01L 2224/16225* (2013.01); *H01L 2224/32145* (2013.01); *H01L 2224/32225* (2013.01); *H01L 2224/48227* (2013.01); *H01L 2224/48464* (2013.01); *H01L 2224/73204* (2013.01); *H01L 2224/73257* (2013.01); *H01L 2224/73265* (2013.01); *H01L 2224/8385* (2013.01); *H01L 2224/92247* (2013.01); *H01L 2224/94* (2013.01); *H01L 2224/97* (2013.01); *H01L 2225/0651* (2013.01); *H01L 2225/06513* (2013.01); *H01L 2225/06517* (2013.01); *H01L 2225/06537* (2013.01);
(Continued)

(58) Field of Classification Search
USPC ......................................................... 438/118
See application file for complete search history.

(56) References Cited

U.S. PATENT DOCUMENTS 6,437,449 B1 8/2002 Foster
7,309,913 B2 12/2007 Shim et al.
(Continued)

*Primary Examiner* — Telly Green
(74) *Attorney, Agent, or Firm* — Slater Matsil, LLP

(57) ABSTRACT

A device includes a spacer, which includes a recess extending from a top surface of the spacer into the spacer, and a conductive feature including a first portion and a second portion continuously connected to the first portion. The first portion extends into the recess. The second portion is on the top surface of the spacer. A die is attached to the spacer, and a lower portion of the first die extends into the recess.

21 Claims, 7 Drawing Sheets

(51) Int. Cl.
  *H01L 23/13*   (2006.01)
  *H01L 23/31*   (2006.01)
  *H01L 25/065*  (2006.01)
  *H01L 21/308*  (2006.01)
  *H01L 21/78*   (2006.01)
  *H01L 23/498*  (2006.01)
  *H01L 23/552*  (2006.01)

(52) U.S. Cl.
  CPC ............. *H01L 2225/06572* (2013.01); *H01L 2924/00014* (2013.01); *H01L 2924/10253* (2013.01); *H01L 2924/15156* (2013.01); *H01L 2924/15184* (2013.01); *H01L 2924/15311* (2013.01); *H01L 2924/181* (2013.01); *H01L 2924/19107* (2013.01); *H01L 2924/3025* (2013.01)

(56) References Cited

U.S. PATENT DOCUMENTS

| | | |
|---|---|---|
| 7,687,897 B2 | 3/2010 | Ha |
| 8,129,824 B1 | 3/2012 | St. Amand et al. |
| 8,373,277 B2 | 2/2013 | Tan |
| 2004/0212099 A1 | 10/2004 | Klein et al. |
| 2009/0014893 A1 | 1/2009 | Abela |
| 2011/0186998 A1 | 8/2011 | Wu et al. |
| 2012/0104623 A1* | 5/2012 | Pagaila .............. H01L 23/13 257/774 |
| 2013/0069218 A1* | 3/2013 | Seah .............. H01L 25/03 257/712 |
| 2013/0105978 A1* | 5/2013 | Hung .............. H01L 33/60 257/751 |

\* cited by examiner

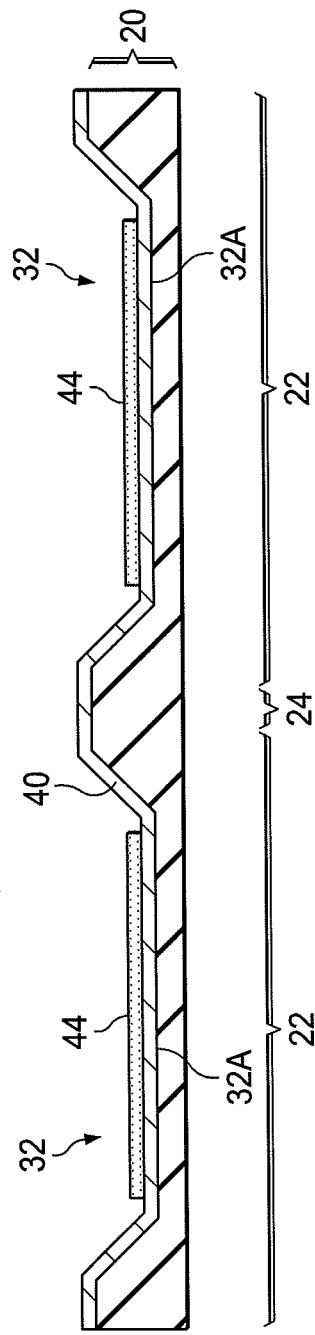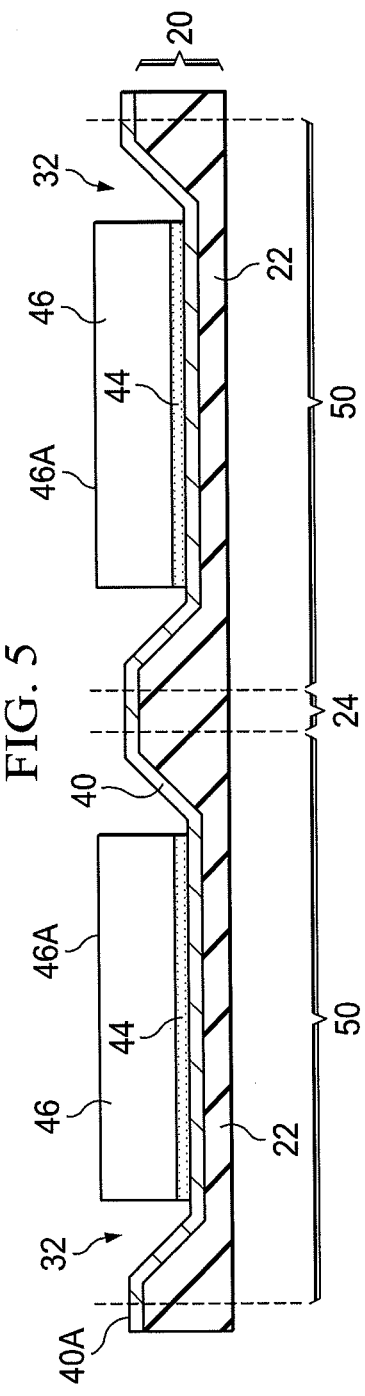

FUNCTIONAL SPACER FOR SIP AND METHODS FOR FORMING THE SAME

PRIORITY CLAIM AND CROSS-REFERENCE

This application is a divisional of U.S. patent application Ser. No. 13/405,018, entitled "Functional Spacer for SIP and Methods for Forming the Same," filed on Feb. 24, 2012, which application is incorporated herein by reference.

BACKGROUND

Spacer is an important component for System-in-Package (SIP) application. Spacers may have various functions. For example, spacers may be inserted between stacked dies, so that the spacing between the stacked dies is increased for wire bonding request. The spacers may be plated with conductive layers, which may further be grounded. Accordingly, the spacers may be used for electrical shielding. When formed of or including thermal conductive materials, the spacers may also be used for dissipating the heat generated in the stacked dies. In addition, the spacers in the SIP packages may also be used for conducting electrical signals.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 6 are cross-sectional views and top views of intermediate stages in the manufacturing of packages in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Packages comprising dies stacked on spacers and the methods of forming the same are provided in accordance with various exemplary embodiments. The intermediate stages of forming a package are illustrated. The variations of the embodiments are discussed. Throughout the various views and illustrative embodiments, like reference numbers are used to designate like elements.

FIGS. 1 through 6 illustrate cross-sectional views and top views of intermediate stages in the manufacturing of packages in accordance with some exemplary embodiments. FIG. 1A illustrates a top view of wafer 20, which includes a plurality of units 22 therein. Units 22 may be chips in some embodiments. Units 22 are separate from each other by scribe lines 24. In accordance with some embodiments, wafer 20 is a silicon wafer comprising crystalline silicon. Alternatively, wafer 20 may be formed of semiconductor materials other than silicon. In other embodiments, wafer 20 may be a dielectric wafer formed of a dielectric material such as ceramic, glass, polymer, and/or combinations thereof. In yet other embodiments, wafer 20 may be formed of a conductive material for thermal dissipation application, which may comprise a metal such as aluminum, copper, nickel, or the like.

Figure 1A:
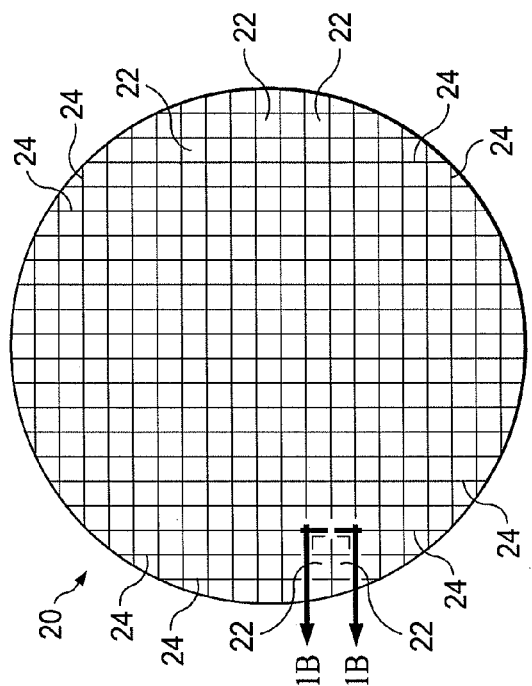
Figure 1B:
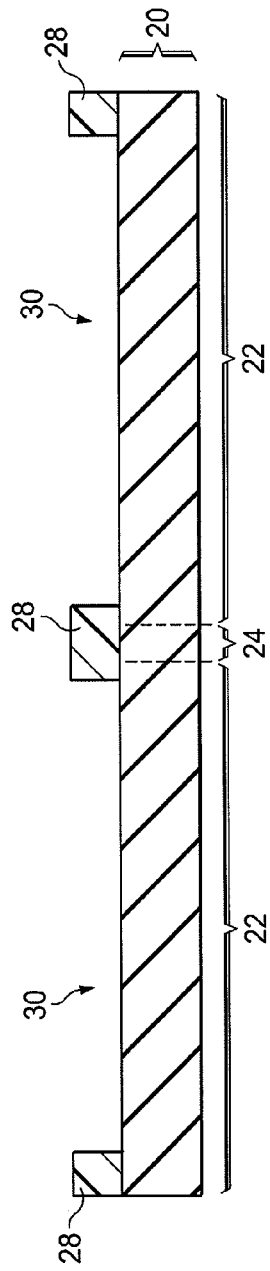

FIG. 1B illustrates a cross-sectional view of wafer 20, wherein the cross-sectional view is obtained from the plane crossing line 1B-1B in FIG. 1A. Mask 28, which may be a photo resist, is formed on wafer 20, and is then patterned. The remaining portion of mask 28 on each of units 22 may form a ring that covers the edge portions of the respective unit 22. The edge portion of mask 28 over one of units 22 may cross over scribe lines 24 to expand onto the edge portions of neighboring units 22. Openings 30 may be formed in mask 28, wherein a central portion of each of units 22 is exposed through one of openings 30.

Figure 2A:
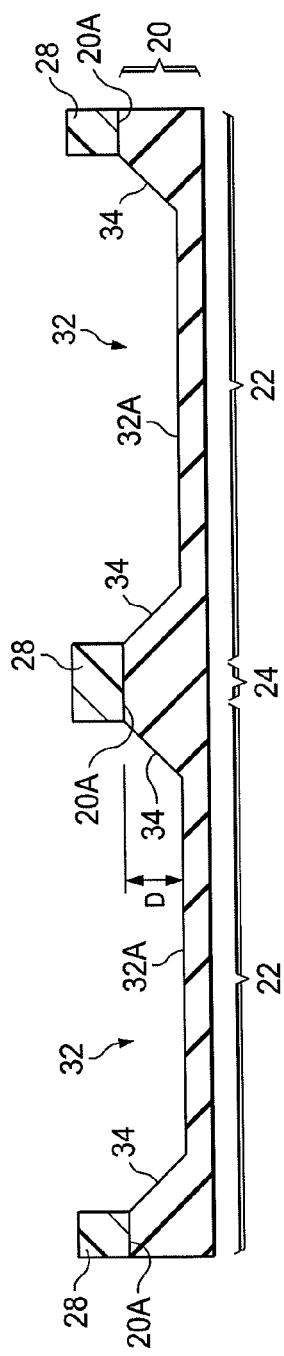

Referring to FIG. 2A, the exposed portions of wafer 20 are recessed through openings 30. As a result, recesses 32 are formed. Recesses 32 extend from top surface 20A of wafer 20 into an intermediate level between a top surface and a bottom surface of wafer 20. The recessing may be performed through etching, which may be dry etching, wet etching, or the like. In the embodiments in which wafer 20 is a silicon wafer, the etching may be performed using wet etching, and potassium hydroxide (KOH) may be used as the etchant, for example. Alternatively, the etching may be performed using dry etching, wherein etching gases may include $SF_6$ or other applicable etching gases. In some embodiments, the etching causes the <111> surface planes of silicon to be exposed, and the resulting sidewalls 34 of recesses 32 are slanted. Alternatively, sidewalls 34 may be substantially vertical and perpendicular to top surface 20A of wafer 20. Bottom surfaces 32A of recesses 32 may be substantially planar.

Figure 2B:
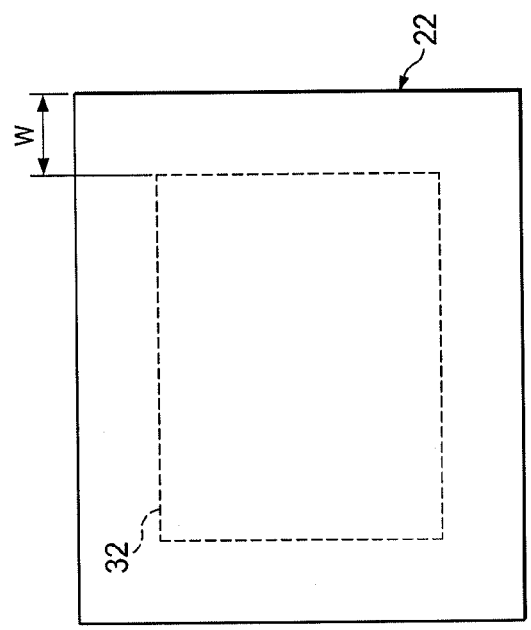

FIG. 2B illustrates a top view of unit 22. In accordance with some embodiments, recess 32 may be located at the center of unit 22, and the un-etched portions of unit 22 form a ring encircling recess 32. Recess 32 may have a rectangular top-view shape, although other shapes may be used. After the etching of wafer 20, mask 28 as in FIG. 2A is removed.

Figure 3A:
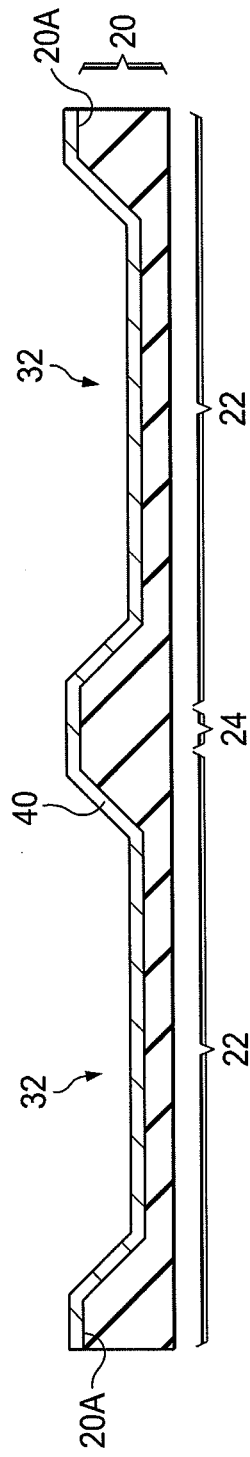

Next, as shown in FIG. 3A, film 40 is formed on wafer 20 as a blanket film. Accordingly, film 40 covers the un-etched portions of top surfaces 20A of wafer 20 and extends into recesses 32. In some embodiments, film 40 is a metal film, which may comprise aluminum, copper, nickel, palladium, silver, gold, combinations thereof, and/or multi-layers thereof. The formation methods may include Physical Vapor Deposition (PVD), plating, or the like. In some exemplary embodiments, film 40 is a composite film including a plurality of layers formed of different materials. For example, film 40 may be formed of Electro-less Nickel Electro-less Palladium Immersion Gold (ENEPIG), which includes a nickel layer, a palladium layer on the nickel layer, and a gold layer on the palladium layer. The gold layer may be formed using immersion plating. In other embodiments, film 40 may be formed of other materials and using other methods, including, but not limited to, Electro-less Nickel Immersion Gold (ENIG), Electro-less Nickel Electro-less Gold (ENEG), immersion tin, immersion silver, or the like. In the embodiments wherein wafer 20 is conductive or semi-conductive, film 40 may include a dielectric layer (not shown) at the bottom to electrically insulate the conductive material in film 40 from wafer 20.

Figure 3B:
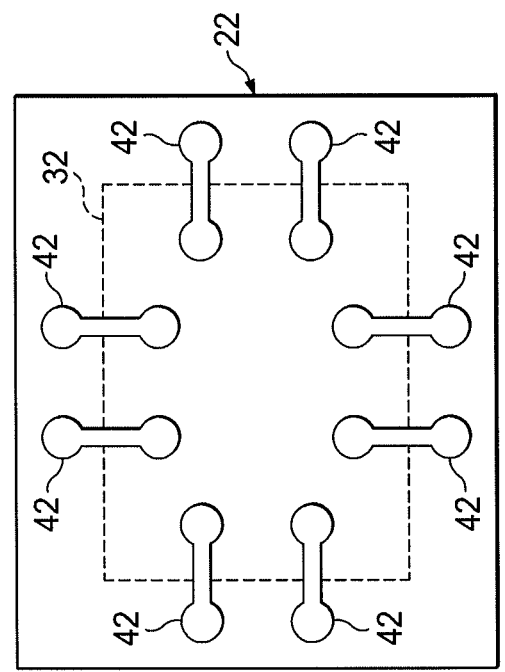

In some embodiments, film 40 is left to cover wafer 20 and the respective units 22 as a blanket film. At the time wafer 20 is sawed apart (as shown in FIG. 5), film 40 may remain not patterned. In alternative embodiments, film 40 may be patterned. For example, FIG. 3B illustrates a top view of an exemplary patterned film 40 on one of units 22. After the patterning, the remaining portions of film 40 includes a plurality of Redistribution Lines (RDLs) 42, which may extend from the bottom surface of recess 32 to top surface 20A (not shown in FIG. 3B, please refer to FIG. 2A) of units 22.

Referring to FIG. 4, adhesive 44 is dispensed onto bottom surfaces 32A of recesses 32. Adhesive 44 may be a polymer-comprising material, which may comprise an epoxy, for example. Adhesive 44 may also include a Thermal Interface Material (TIM) that has a good thermal conductivity. The exemplary adhesive 44 may include an epoxy material, for example. Adhesive 44 may be a dielectric film, which electrically disconnect the subsequently attached package component 46 (FIG. 5) from unit 22.

Referring to FIG. 5, package components 46 are attached to adhesive 44, wherein each of recesses 32 may receive one of package components 46. Package components 46 may be device dies that include active devices such as transistors therein. Alternatively, package components 46 may be packages. Top surfaces 46A of package components 46 may be higher than, substantially level with, or lower than, top surface 40A of the portions of film 40 that are outside recesses 32. At least lower portions, and possibly entireties, of package components 46 may be disposed in recesses 32.

After some (or all) recesses 32 in wafer 20 are attached with package components 46, wafer 20 may be sawed apart along scribe lines 24 into a plurality of packages 50. Each of packages 50 may include one of units 22 and the respective package component 46.

Figure 6:
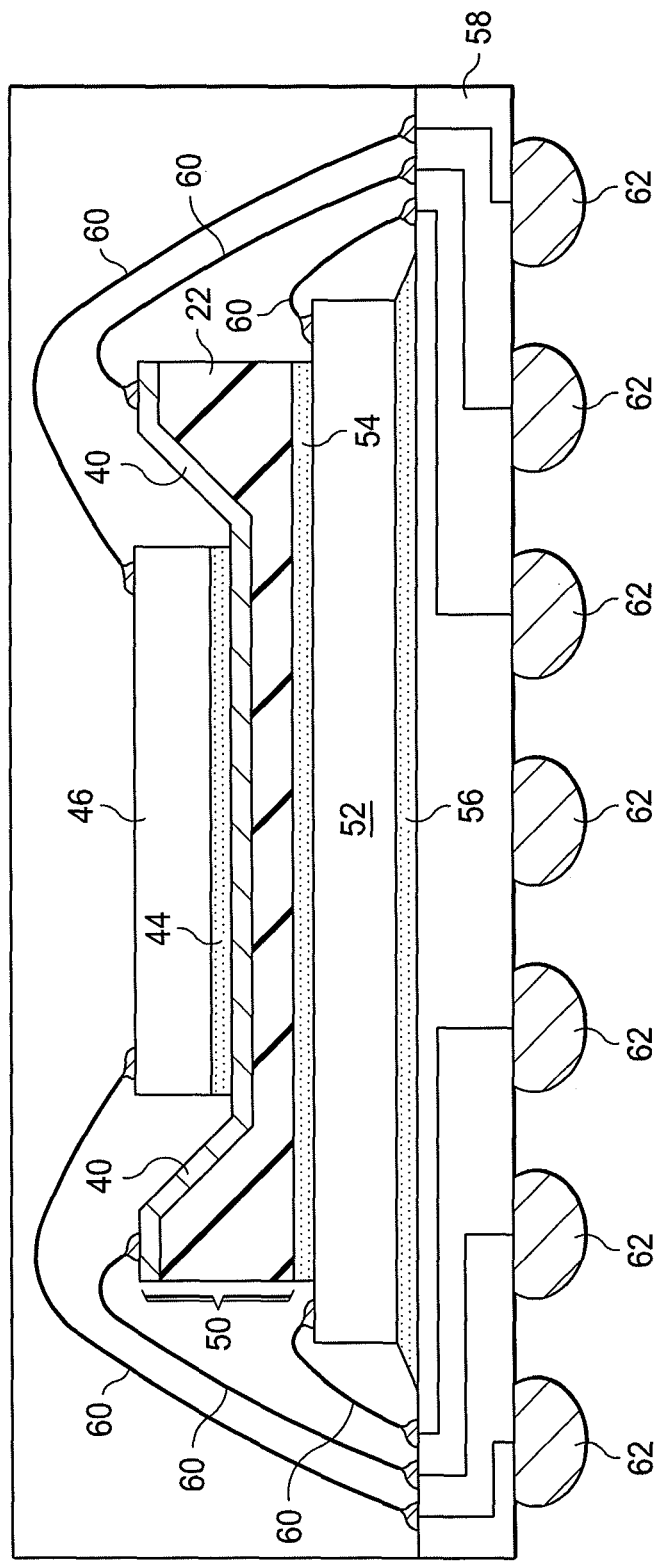

Next, package 50 may be further stacked with additional dies, package substrates, interposers, Printed Circuit Boards (PCBs), and/or the like. FIG. 6 illustrates an exemplary resulting package. In some embodiments, package 50 is stacked on package component 52 through adhesive 54. Adhesive 54 may be essentially the same as adhesive 44. Package component 52 may be a device die in an exemplary embodiment. Package component 52 may be further attached to package component 58 through adhesive 56. Package component 52 may be a package substrate, an interposer, a PCB, or the like.

In some embodiments, the wire bonding is used to electrically couple package components 46 and 52 and film 40 to package component 58 through metal wires 60. In some embodiments, film 40 is a blanket film, and the wires 60 that are connected to film 40 may be electrically coupled to the electrical ground, and may be used for electrical shielding and grounding. The electrical connections (wires) 60 may be electrically coupled to connectors 62 through the electrical connections embedded in package component 58.

Figure 7:
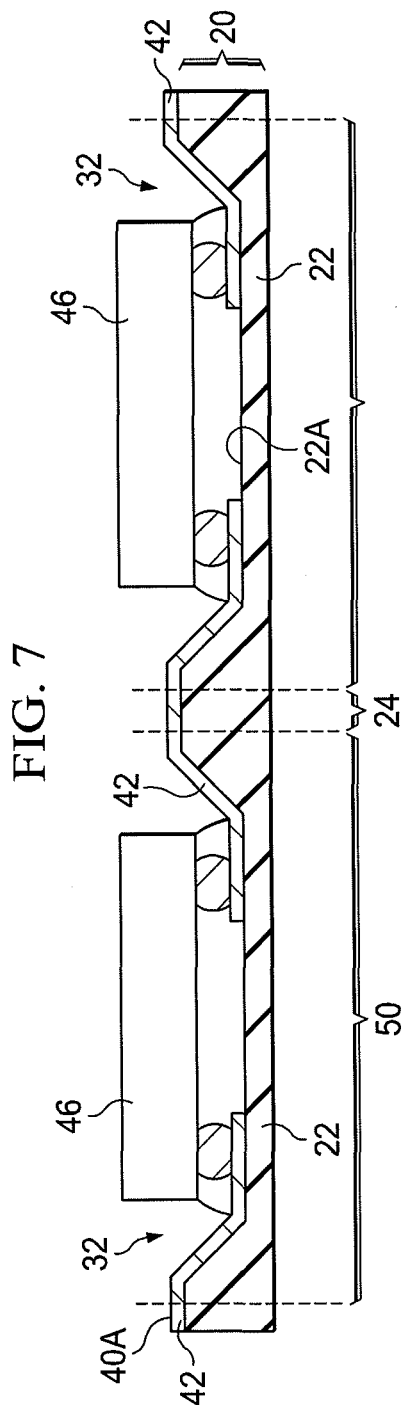
FIGS. 7 and 8 illustrate the cross-sectional views of intermediate stages in the manufacturing of packages in accordance with some alternative exemplary embodiments.
Figure 8:
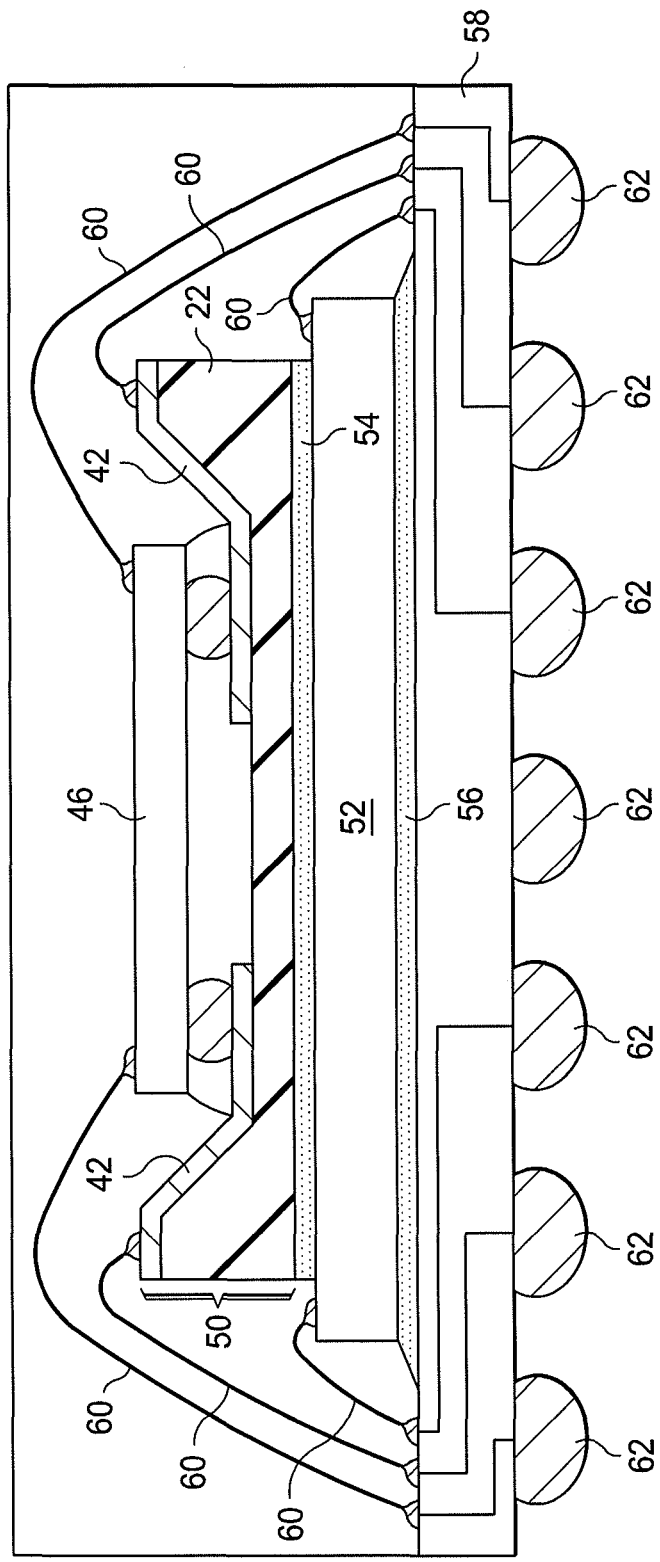

FIGS. 7 and 8 illustrate the cross-sectional views of the formation and the stacking of package 50 in accordance with alternative embodiments. Unless specified otherwise, the materials and formation methods of the components in these embodiments are essentially the same as the like components, which are denoted by like reference numerals in the embodiment shown in FIGS. 1 through 6. The formation details of the embodiment shown in FIGS. 7 and 8 may thus be found in the discussion of the embodiment shown in FIGS. 1 through 6.

The initial steps of these embodiments are essentially the same as shown in FIGS. 1A through 3B. In these embodiments, film 40 is patterned to form a plurality of RDLs 42, which is shown in FIG. 3B. Next, referring to FIG. 7, package components 46 are bonded to RDLs 42 through flip-chip bonding. RDLs 42 forms the fan-out structure that electrically couples package component 46 (and the integrated circuits formed therein) to top surface 22A of unit 22. After the bonding of package components 46 to wafer 20, a singulation is performed to separate packages 50 from each other. The resulting packages 50 may then be further packaged.

FIG. 8 illustrates an exemplary package that include package 50. In these embodiments, wires 60 that are connected to RDLs 42 may be used to conduct the electrical signals between package components 46 and 52, or between package components 46 and 52.

In the embodiments, unit 22 (FIGS. 6 and 8, referred to as spacer 22 hereinafter) acts as a spacer that spaces the overlying package component 46 from the underlying package component 52. In some embodiments, no through-connection is formed in spacer 22 to electrically interconnect the conductive features (if any) on the opposite sides of spacers 22. Furthermore, spacer 22 may be free from active devices such as transistors therein. Spacer 22 may also be free from passive devices such as resistors and capacitors therein. Since the formation of spacers 22 and the stacking of package component 46 to spacers 22 are performed at wafer-level, the throughput of the manufacturing process is improved.

In accordance with embodiments, a device includes a spacer, which includes a recess extending from a top surface of the spacer into the spacer, and a conductive feature including a first portion and a second portion continuously connected to the first portion. The first portion extends into the recess. The second portion is on the top surface of the spacer. A die is attached to the spacer, and a lower portion of the first die extends into the recess.

In accordance with other embodiments, a wafer includes a plurality of chips. The wafer is free from active devices and passive devices therein, and is free from through-connections penetrating through the wafer. Each of the plurality of chips includes a recess extending from a top surface of the wafer into the wafer, and a metal feature extending into the recess to contact a bottom of the recess, a sidewall of the recess, and the top surface of the wafer. A plurality of dies is attached to the wafer, wherein each of the plurality of dies includes a portion disposed in the recess of one of the plurality of chips.

In accordance with yet other embodiments, a method includes forming a plurality of recesses in a wafer, and forming a metal film on the wafer. The metal film extends into the plurality of recesses. The metal film includes portions on a top surface of non-recessed portions of the wafer. A plurality of dies is attached to the wafer. Each of the plurality of dies includes a portion located in one of the plurality of recesses. After the step of attaching the plurality of dies, the wafer is sawed into a plurality of packages. Each of the plurality of packages includes a piece of the wafer. The piece of the wafer includes one of the plurality of recesses and one of the plurality of dies.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a plurality of recesses extending from a top surface of a wafer into the wafer;
    forming a metal film on the wafer, wherein the metal film extends into the plurality of recesses, and wherein the metal film comprises portions on portions of the top surface that are not recessed;
    attaching a plurality of dies to the wafer, wherein each of the plurality of dies comprises a portion located in one of the plurality of recesses; and
    sawing the wafer into a plurality of packages, wherein each of the plurality of packages comprises a piece of the wafer and one of the plurality of dies, wherein the piece of the wafer comprises one of the plurality of recesses, and wherein the piece of the wafer is electrically decoupled from the corresponding one of the plurality of dies.

2. The method of claim 1, wherein the wafer is free from through-connections penetrating through the wafer.

3. The method of claim 1 further comprising adhering a plurality of adhesive films into the plurality of recesses, wherein each of the plurality of dies is attached to the wafer through one of the plurality of adhesive films.

4. The method of claim 1 further comprising patterning the metal film to form a plurality of redistribution lines, wherein each of the plurality of redistribution lines comprises a first portion extending into a respective one of the plurality of recesses, and a second portion over the top surface of the wafer, and wherein the attaching the plurality of dies comprises bonding the plurality of dies to the plurality of redistribution lines.

5. The method of claim 1, wherein when the plurality of dies is attached to the wafer, the metal film remains to be a blanket film covering an entirety of the wafer.

6. The method of claim 1, wherein the step of forming the plurality of recesses comprises:
    forming a mask over the wafer;
    patterning the mask to form a plurality of openings in the mask; and
    etching portions of the wafer through the plurality of openings to form the plurality of recesses.

7. The method of claim 1, wherein the wafer is a silicon wafer, and the plurality of recesses comprise slanted sidewalls.

8. The method of claim 1, wherein the wafer is a dielectric wafer.

9. A method comprising:
    forming a patterned etching mask over a wafer;
    etching the wafer through the patterned etching mask to form a plurality of recesses extending from a top surface of the wafer into the wafer;
    removing the patterned etching mask;
    depositing a blanket conductive film over the wafer, wherein the blanket conductive film comprises first portions over the top surface of the wafer, and second portions extending into the plurality of recesses;
    attaching a device die in a corresponding one of the plurality of recesses;
    sawing the wafer to form a plurality of discrete spacer units, with each of the plurality of discrete spacer units comprising one of the plurality of recesses;
    forming a wire bond to remaining portions of the blanket conductive film in one of the plurality of discrete spacer units, the device die being electrically decoupled from the blanket conductive film.

10. The method of claim 9, wherein the wire bond is connected to an electrical ground.

11. The method of claim 9, wherein the device die is attached to the one of the plurality of discrete spacer units through an adhesive.

12. The method of claim 9, wherein the wafer is etched through wet etching.

13. The method of claim 9, wherein each of the recesses comprises a slant edge.

14. The method of claim 9 further comprising connecting the wire bond to a package substrate, an interposer, or a Printed Circuit Board (PCB).

15. A method comprising:
    forming a recess in a semiconductor chip;
    forming a blanket metal film on the semiconductor chip;
    attaching a back surface of a die to the blanket metal film;
    electrically grounding the blanket metal film;
    attaching the semiconductor chip to a first package component, the first package component having an outermost sidewall perpendicular to a topmost surface, the topmost surface facing the semiconductor chip, the first package component having a width measured parallel to the topmost surface greater than that of the semiconductor chip, the semiconductor chip being interposed between the die and the first package component; and
    attaching the first package component to a second package component, the die being electrically coupled to the second package component by a conductive material, the conductive material extending outside the outermost sidewall of the first package component.

16. The method of claim 15, wherein the electrically grounding the blanket metal film comprises forming a wire bond on the blanket metal film.

17. The method of claim 16, wherein after the wire bond is formed, the blanket metal film remains to be a blanket film.

18. The method of claim 15, wherein the die is attached to the blanket metal film through an adhesive film, and the adhesive film is in the recess.

19. The method of claim 15, wherein the blanket metal film is formed on a semiconductor wafer, with the semiconductor chip being a chip in the semiconductor wafer, and the method further comprises sawing the semiconductor wafer into semiconductor chips.

20. The method of claim 15, wherein the forming the recess comprises etching a semiconductor material of the semiconductor chip to form the recess, wherein the recess comprises slant sidewalls and a flat bottom.

21. The method of claim 15, further comprising electrically coupling the die, the blanket metal film, and the first package component to the second package component, wherein a separate wire bond electrically couples each component directly to the second package component.

* * * * *

UNITED STATES PATENT AND TRADEMARK OFFICE
CERTIFICATE OF CORRECTION

PATENT NO. : 10,020,284 B2
APPLICATION NO. : 14/867893
DATED : July 10, 2018
INVENTOR(S) : Yu-Ru Chang It is certified that error appears in the above-identified patent and that said Letters Patent is hereby corrected as shown below:

In the Claims

In Column 6, Line 63, Claim 21, delete "directly".

Signed and Sealed this
Fourth Day of September, 2018

Andrei Iancu
*Director of the United States Patent and Trademark Office*